United States Patent
Santiago et al.

(10) Patent No.: US 6,716,287 B1
(45) Date of Patent: Apr. 6, 2004

(54) PROCESSING CHAMBER WITH FLOW-RESTRICTING RING

(75) Inventors: James V. Santiago, Boise, ID (US); Damian W. Sower, Meridian, ID (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/273,551

(22) Filed: Oct. 18, 2002

(51) Int. Cl.[7] .............................................. C23C 16/00
(52) U.S. Cl. ..................... 118/729; 118/728; 438/680; 438/681; 438/758; 438/935
(58) Field of Search .......................... 118/715, 723 R, 118/728, 729; 438/680, 681, 758

(56) References Cited

U.S. PATENT DOCUMENTS

| | | | |
|---|---|---|---|
| 5,707,486 A | 1/1998 | Collins | 156/643.1 |
| 5,824,158 A | 10/1998 | Takeuchi et al. | 118/723 IR |
| 5,968,276 A | 10/1999 | Lei et al. | 118/723 R |
| 6,063,440 A * | 5/2000 | Chen et al. | 427/248.1 |
| 6,143,078 A | 11/2000 | Ishikawa et al. | 118/715 |
| 6,176,198 B1 | 1/2001 | Kao et al. | 118/723 ME |
| 6,194,038 B1 * | 2/2001 | Rossman | 427/569 |
| 6,261,408 B1 | 7/2001 | Schneider et al. | 156/345 |
| 6,273,022 B1 | 8/2001 | Pu et al. | 118/723 I |
| 6,436,192 B2 * | 8/2002 | Chen et al. | 118/696 |
| 6,527,910 B2 * | 3/2003 | Rossman | 156/345.43 |
| 2001/0037771 A1 * | 11/2001 | Chen et al. | 118/728 |

OTHER PUBLICATIONS

Schneider, et al., "Method and Apparatus for Semiconductor Processing Chamber Pressure Control", U.S. patent application Ser. No. 09/505,576, filed Feb. 16, 2000.

Noorbakhsh, et al., "Temperature Controlled Semiconductor Processing Chamber Liner", U.S. patent application Ser. No. 09/519,719, filed Mar. 7, 2000.

"Plasma Reactor Cooled Ceiling with an Array of Thermality Isolated Plasma Heated Mini–Gas Distribution Plates", U.S. patent application Ser. No. 09/461,682, filed Dec. 14, 1999.

* cited by examiner

Primary Examiner—Alexander Ghyka
(74) Attorney, Agent, or Firm—Moser, Patterson, and Sheridan

(57) ABSTRACT

A processing chamber with a flow-restricting ring is generally provided. In one embodiment, a processing chamber includes a chamber body, a lid assembly, a substrate support and a flow-restricting ring. The chamber body has sidewalls and a bottom. The lid assembly is disposed on the sidewalls and encloses an interior volume of the chamber body. The substrate support is disposed in the interior volume of the chamber body and is adjustable in elevation between the lid assembly and the bottom of the chamber body. The flow-restricting ring has an outer edge disposed proximate the sidewalls of the chamber body and an inner edge disposed proximate the substrate support when the substrate support is disposed in an elevated position. The inner edge of the ring and the substrate support are disposed in a spaced-apart relation defining an annular flow control orifice. The flow control orifice disposed proximate the substrate support enhances flow uniformity across the diameter of a substrate seated on the substrate support during processing.

19 Claims, 4 Drawing Sheets

US 6,716,287 B1

PROCESSING CHAMBER WITH FLOW-RESTRICTING RING

BACKGROUND OF THE INVENTION

1. Field of the Invention

Embodiments of the invention generally relate to processing chambers having a restricting ring for improving flow uniformity.

2. Background of the Related Art

Integrated circuits have evolved into complex devices that can include millions of transistors, capacitors and resistors on a single chip. The evolution of chip designs continually requires faster circuitry and greater circuit density that demand increasingly precise fabrication techniques and processes. One fabrication process frequently used is chemical vapor deposition (CVD).

Chemical vapor deposition is generally employed to deposit a thin film on a substrate or semiconductor wafer. Chemical vapor deposition is generally accomplished by introducing a precursor gas into a vacuum chamber. The precursor gas is typically directed through a showerhead or other inlet situated near the top of the chamber. The precursor gas reacts to form a layer of material on the surface of the substrate that is positioned on a heated substrate support.

The uniformity of the material deposited during chemical vapor deposition processes is dependent on many factors, including the uniformity of the flow of precursor gas across the diameter of the substrate. As many process chambers have a vacuum port formed through the sidewalls of the vacuum chamber, the pumping conductance is generally highest at the edges of the substrate closest to the vacuum port. This results in increased flows over this area while less precursor, and hence, less deposited material, is present over the other regions of the substrate.

One evolving CVD technique is known as atomic layer deposition. ALD is a specialized chemical vapor deposition technique that deposits a film one molecule thick on the substrate during each deposition cycle. This is typically accomplished by providing a gas flow sequence of discrete, small volumes of reactant and precursor gases separated by a purge. As these volumes of gas flow are small as compared to conventional CVD processes, the uniformity of gas delivery to the substrate surface is of even greater importance than in conventional CVD processing chambers.

Therefore, is a need for a processing chamber having improved gas flow uniformity.

SUMMARY OF THE INVENTION

One aspect of the present invention generally provides a processing chamber having a flow-restricting ring for enhancing flow uniformity over substrates processed within the processing chamber. In one embodiment, a processing chamber includes a chamber body, a lid assembly, a substrate support and a flow-restricting ring. The chamber body has sidewalls and a bottom. The lid assembly is disposed on the sidewalls and encloses an interior volume of the chamber body. The substrate support is disposed in the interior volume of the chamber body and is adjustable in elevation between the lid assembly and the bottom of the chamber body. The flow-restricting ring has an outer edge disposed proximate the sidewalls of the chamber body and an inner edge disposed proximate the substrate support when the substrate support is disposed in an elevated position. The inner edge of the ring and the substrate support are disposed in a spaced-apart relation defining an annular flow control orifice. The flow control orifice enhances flow uniformity across a substrate positioned on the substrate support during processing.

In another embodiment, a processing chamber includes a chamber body, a lid assembly, a substrate support assembly, a ring and a seal. The chamber body includes sidewalls and a bottom. The lid assembly is disposed on the sidewalls and encloses an interior volume of the chamber body. The substrate support assembly is disposed in the interior volume of the chamber body and is adjustable in elevation between the lid assembly and the bottom of the chamber body. The ring is disposed between the lid assembly and the sidewalls. The ring has an outer edge disposed proximate the sidewalls and inner edge proximate the substrate support assembly. The ring has a plurality of holes formed therethrough. The substrate support may be elevated to a position to contact the seal, thus prevetning flow between the substrate support assembly and the ring.

In another aspect, a method for controlling flow in the processing chamber is provided. In one embodiment, the method includes the steps of elevating the substrate support assembly to a position proximate a ring, wherein the ring and substrate support define an annular orifice radially outward of the substrate support, flowing gas into a processing region defined above the substrate support and the ring, flowing gas from the processing region through the annular orifice to a pumping plenum and exhausting gas from the pumping plenum through an exhaust port disposed in the processing chamber.

In another embodiment, a method for controlling the flow of the processing chamber includes the steps of elevating a support assembly to sealingly contact a ring disposed in the processing chamber, flowing gas into a processing region defined above the substrate support assembly and the ring, flowing gas from the processing region through a plurality of holes formed in the ring to a pumping plenum and exhausting gas from the pumping plenum through an exhaust port disposed in the processing chamber.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of Its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Embodiments of the present invention generally provide a processing system having a flow-restriction ring disposed therein that enhances radial flow uniformity of gases introduced into the chamber and flowed over a substrate. Embodiments of the invention are typically described below referencing a chemical vapor deposition chamber, such as a WxZ™ metal vapor deposition (MCVD) chamber, available from Applied Materials, Inc. of Santa Clara, Calif. However, it should be understood that the invention has utility for providing uniform flow in other types of chambers.

Figure 1:
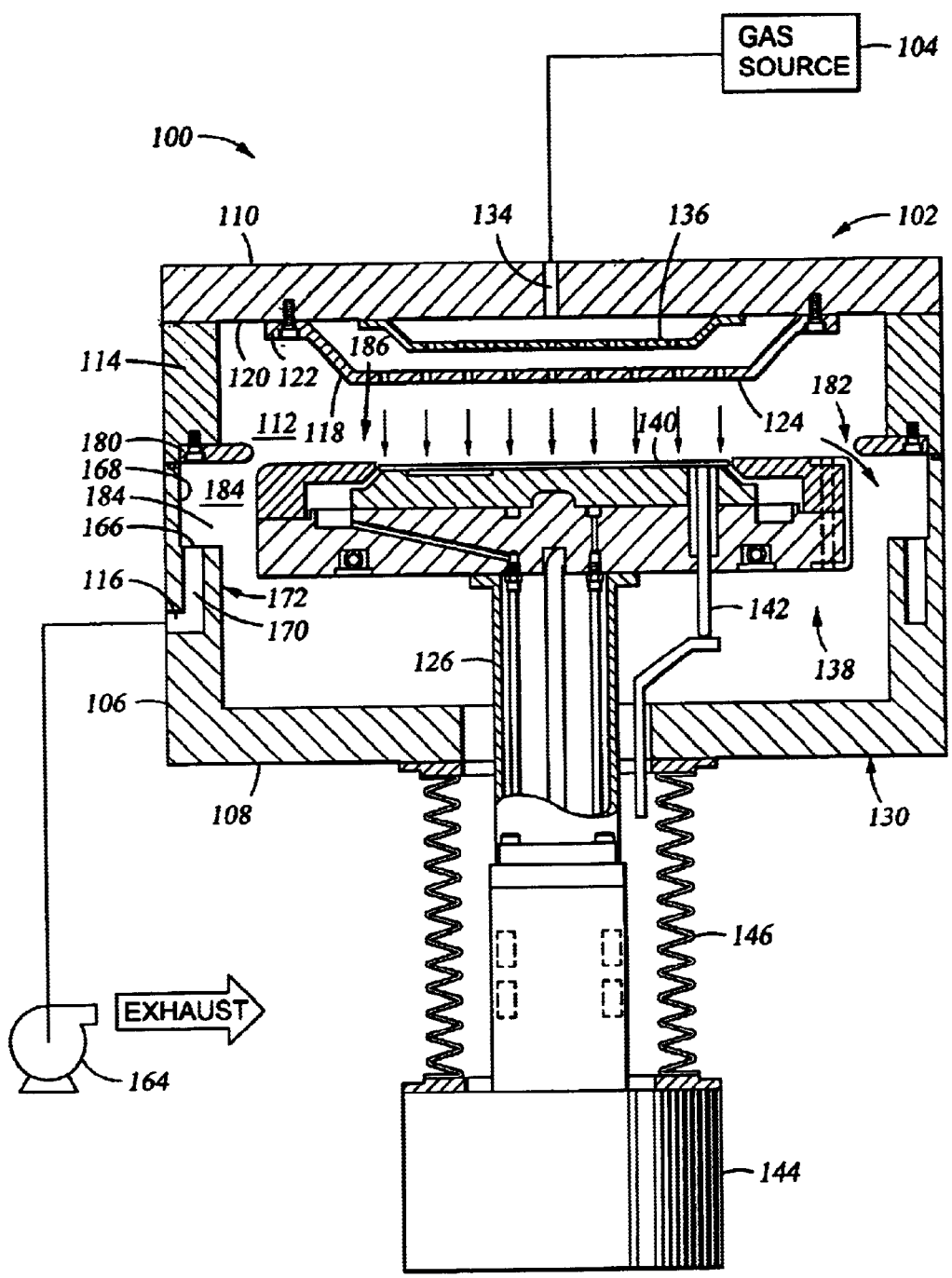
FIG. 1 depicts a schematic, sectional view of one embodiment of a processing chamber having a flow-restricting ring disposed therein.

FIG. 1 is a cross-sectional view of one embodiment of a chemical vapor deposition system 100. The system 100 generally includes a chamber body 130 coupled to at least one gas source 104. The chamber body 130 has walls 106, a bottom 108 and a lid assembly 102 that define a process volume 112. The walls 106 and the bottom 108 are typically fabricated from a unitary block of aluminum. The walls 106 of the chamber 100 generally include an annular pumping channel 170 formed in the walls 106. An interior surface 172 of the walls 106 include an annular groove 168 that couples a top 166 of the pumping channel 170 to the process volume 112. The groove 168 defines a portion of a pumping plenum 184 that provides a high conductance volume upstream of the pumping channel 170. An exhaust port 116 is disposed through the walls 106 and couples the pumping channel 170 to a pumping system 164 that facilitates evacuating gases from the interior volume 112 of the chamber body 130.

The lid assembly 102 includes a lid 110 and a flange 114. The lid 110 is typically oriented parallel to the chamber bottom 108. The flange 114 extends downward from the perimeter of the lid 110. The flange 114 may be a separate element or an integral part of the lid 110. The flange 114 may alternatively be part of the sidewalls 106.

The lid assembly 102 is supported by the walls 106 and can be removed to service the chamber body 130. The lid assembly 102 is typically made of aluminum and may contain heat transfer fluid channels (not shown) for regulating the temperature of the lid 110 by flowing a heat transfer fluid therethrough.

A showerhead 118 is coupled to the interior side 120 of the lid 110. The showerhead 118 is typically fabricated from aluminum. The showerhead 118 generally includes a permanent mounting ring 122 that surrounds a dish-shaped center section 124. The center section 124 includes a perforated area 132 that allows for passage of process and other gases therethrough.

A mixing block 134 is disposed in the lid 110. The mixing block 134 is coupled to the gas source 104 such that process and other gases may be introduced into the process volume 112 by passing through the mixing block 134 and showerhead 118. A blocker plate 136 may be disposed between the showerhead 118 and the mixing block 134 to enhance the uniform distribution of gases passing through the showerhead 118 and into the chamber body 130.

A support assembly 138 is disposed beneath the showerhead 118. The support assembly 138 supports a substrate 140 during processing. The support assembly 138 may include a heater and/or electrostatic chuck. The support assembly 138 is coupled to a lift mechanism 144 by a shaft 126. The lift mechanism 144 enables the support assembly 138 to be moved between an upper position proximate the showerhead 118 as shown in FIG. 1 and a lower position that facilitates substrate transfer between the support assembly 138 and a robot (not shown). Bellows 146 provide a vacuum seal between the process volume 112 and the atmosphere outside the chamber 100 while facilitating the movement of the support assembly 138.

A plurality of lift pins 142 are disposed through the support assembly 138. Generally, the lift pins 142 may be actuated to elevate the substrate 140 from the substrate support to facilitate transfer into and out of the chamber body 130. The mechanisms associated with actuating the lift pins 142 have been omitted from FIG. 1 for clarity.

A flow-restricting ring 180 is disposed between the sidewalls 106 and the lid 110. The ring 180 extends radially inward from the walls 106 and separates the pumping plenum 184 from a processing region 186 defined between the lid assembly 102 and the substrate support assembly 138. The ring 180 defines an annular flow control orifice 182 with the support assembly 138. The groove 168 in the sidewall 106 forms the annular pumping plenum 184 with the support assembly 138 that provides a sufficient volume having high conductance between the pumping channel 170 and the orifice 182 to draw flow uniformly through the orifice 182 from the processing volume 120. The uniform flow across the circumference of the orifice 182 results in radial uniformity of process gas flow across the surface of the substrate 140, thereby enhancing substrate processing.

Figure 2:
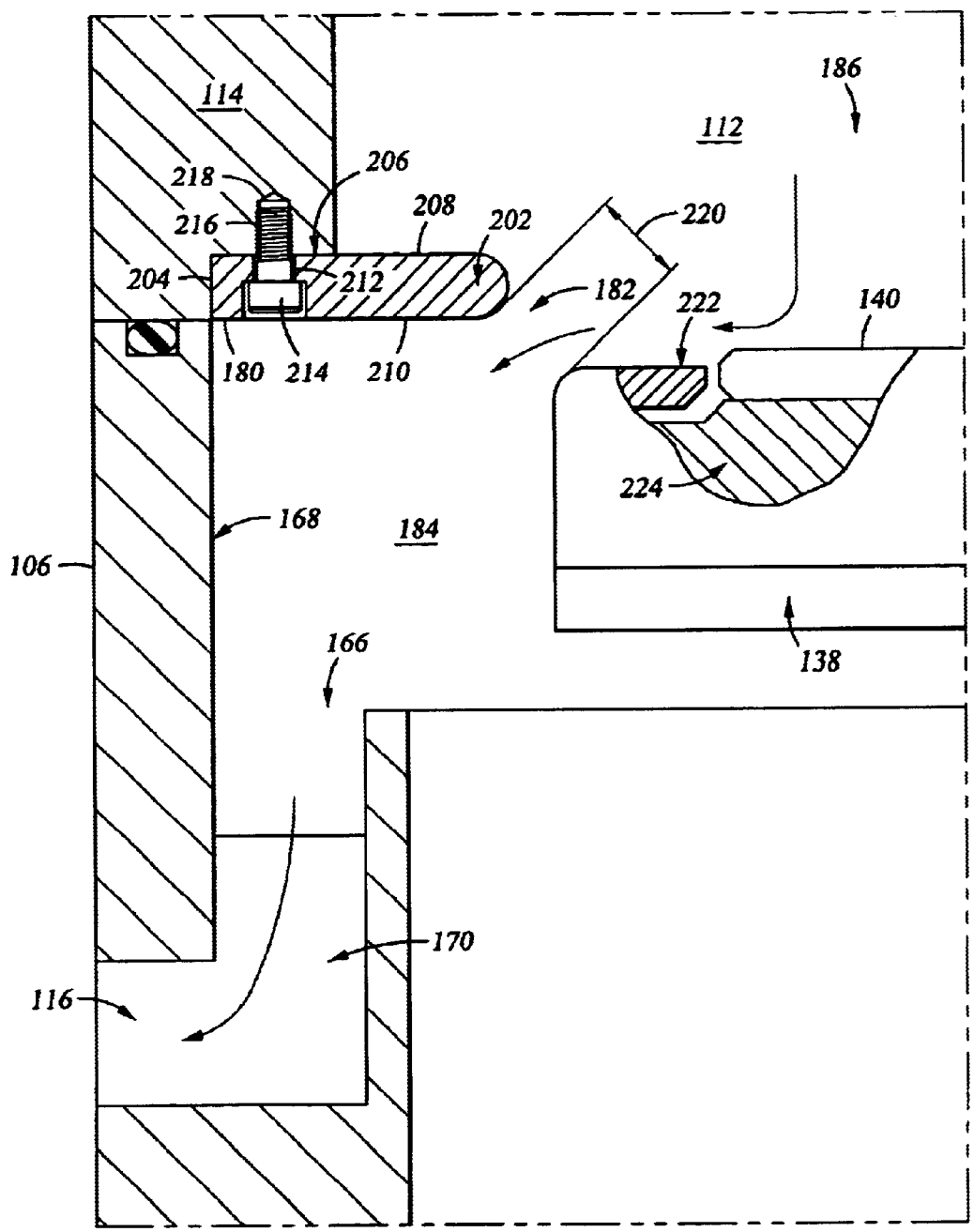
FIG. 2 depicts a partial sectional view of one embodiment of the processing chamber and the flow-restricting ring depicted in FIG. 1.

FIG. 2 depicts a partial sectional view of the flow-restricting ring 180 and the substrate support assembly 138. The flow-restricting ring 180 is typically fabricated from aluminum, nickel or other material compatible with process chemistries. The flow-restricting ring 180 generally includes a first edge 202 defining an inner diameter of the ring 180 and a second edge 204 defining an outer diameter. The first edge 202 typically includes a radius or chamfer to promote flow through the orifice 182.

The flow-restricting ring 180 also includes a first surface 208 and an opposing second surface 210. The first surface 208 generally faces the processing volume 212 while the second surface 210 faces the plenum 184. A portion of the first surface adjacent the second edge 204 is disposed in a notch 208 formed in the flange 114. A plurality of holes 212 formed through the ring 180 facilitate coupling the ring 180 to the lid assembly 102 (or alternatively, the sidewalls 106). Each hole 212 includes a counter bore 214 that allows a head of a vented fastener 216 to be recessed below the second surface 210. The fastener 216 threads into a blind threaded hole 218 formed in the flange 114 to secure the flow-restricting ring 180.

The first edge 202 is generally disposed at a distance 220 from the support assembly 138 to define the annular orifice 182. The annular orifice 182 may be defined between the first edge 202 of the ring 108 and the substrate support 224, a purge ring 222 or other portion of the support assembly 138. The distance 220 is typically about 100 to about 300 mils. However, the distance 220 may be varied depending on chemistries utilized, the substrate size and the desired flow rates for particular processes.

Figure 3:
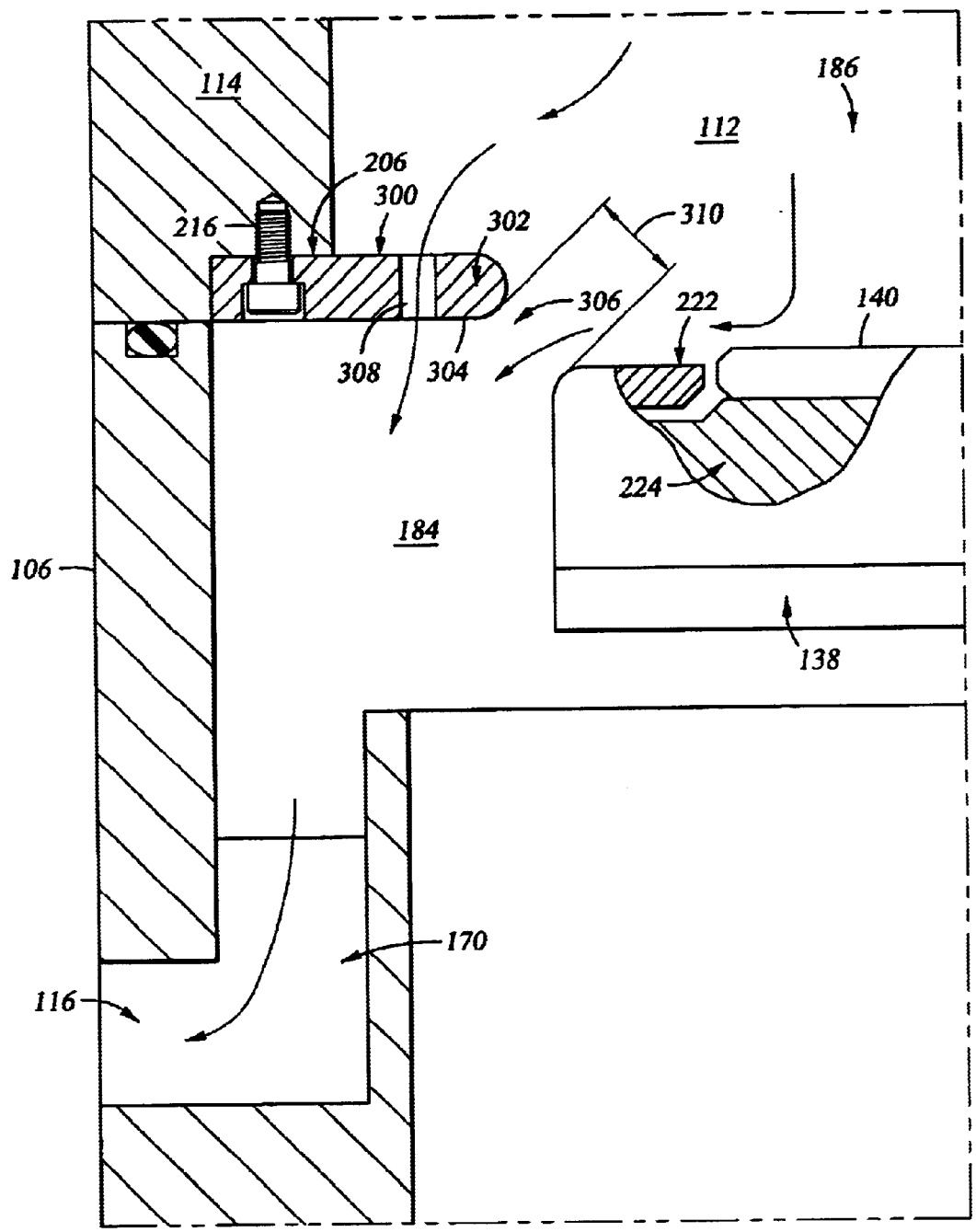
FIG. 3 depicts a partial sectional view of another embodiment of a flow-restricting ring.

FIG. 3 depicts another embodiment of a flow-restricting ring 300 that defines an annular flow-restricting orifice 306 between the ring 300 and a substrate support assembly 138. Generally, the ring 300 is configured similar to the ring 180, and includes a first surface 302 facing the process volume 112 and a second side 304 facing the pumping plenum 184. The ring 300 additionally includes a plurality of holes 308 formed between the first side 302 and the second side 304. The diameter and number of the holes 308 may be controlled with greater precision than a distance 310 across the orifice 306. Accordingly, the sectional area of the holes 308 provides repeatable flow control between the showerhead 118 and the exhaust port 116 with less complexity than repeatably controlling the distance 310 across the orifice 306 after each substrate support assembly 138 change in elevation. Thus, the repeatability of flow across the substrate 140 will be less dependent on the ability of the lift mechanism (not shown) to place the support assembly 138 in a position that repeatedly re-establishes the same distance 310.

Figure 4:
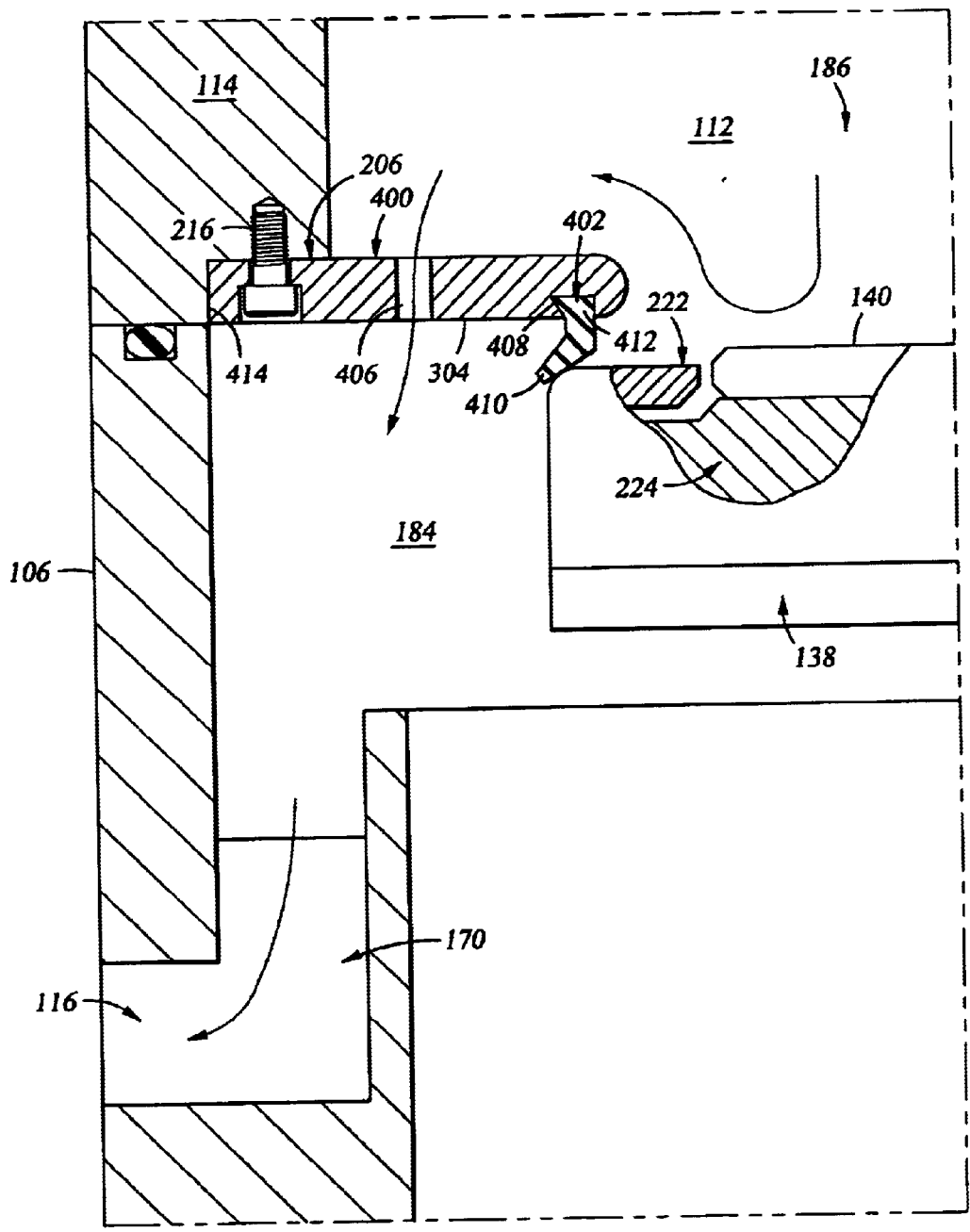
FIG. 4 depicts a sectional view of another embodiment of a flow-restricting ring.

FIG. 4 depicts another embodiment of a flow-restricting ring 400. The flow-restricting ring 400 is configured similarly to the ring 300, having a first end 404 and a second end 414. The second end 414 is disposed in a notch 206 of the flange 114, and in one embodiment, is secured thereto by fasteners 216. The ring 400 additionally includes a seal 402 disposed between an inner end 404 of the ring 400 and the support assembly 138. The seal 402 substantially prevents gas flow between the ring 400 and the substrate support assembly 138. Thus, all of the flow entering the process volume 112 must flow through a plurality of holes 406 (one of which is shown in FIG. 4) formed through the ring 400 to the plenum 184 before being drawn out the exhaust port 116.

The seal 402 is typically fabricated from a material compatible with process chemistries. Such materials typically include CHEMREZ®, KALREZ®, fluoropolymers, PTFE and PFA among others. In one embodiment, the seal 402 is fabricated from TEFLON®. The seal 402 may be an o-ring, a gasket, a cup seal, a custom profile or other seal capable of providing a substantially gas-tight seal between the support assembly 138 and the ring 400. The seal 402 may be coupled to the ring 400, substrate support assembly 138, the purge ring 222, the substrate support body 224 or other component.

In one embodiment, a slot 408 is provided in the flow-restricting ring 400 formed proximate the radially disposed inner end 404 that accepts a portion of the seal 402, thereby retaining the seal 402 to the flow-restricting ring 400 as the substrate support assembly 138 is raised and lowered. Alternatively, the seal 402 may be coupled to and/or retained by the support assembly 138. In the embodiment depicted in FIG. 4, the seal 402 includes a lip 410 extending radially outward from an annular base portion 412 disposed in the slot 408. The lip 410 allows purged gases to sweep the surface of the seal 402 facing the process region 186 so that process and other gases are not trapped on the substrate side of the seal 402.

It should be noted that many existing processing chambers may be readily modified to incorporate a flow-restricting ring to improve gas flow within the processing chamber. For example, a lid could be modified to receive the flow-restrictng ring and utilized with an unmodified, conventional chamber body, thus realizing gas flow improvements at a fraction of the cost of a processing chamber.

While the foregoing is directed to the preferred embodiment of the present invention, other and further embodiments of the invention may be devised without departing from the basic scope thereof. The scope of the invention is determined by the claims that follow.

What is claimed is:

1. A processing chamber comprising:
   a chamber body having sidewalls and a bottom;
   a lid assembly disposed on the sidewalls and enclosing an interior volume of the chamber body;
   a substrate support assembly disposed in the interior volume of the chamber body and having an elevation adjustable between the lid assembly and the bottom of the chamber body; and
   a ring having an outer edge disposed proximate the sidewalls and an inner edge disposed proximate the substrate support assembly when the substrate support assembly is disposed in an elevated position, the inner edge and the substrate support assembly disposed in a spaced-apart relation defining an annular flow control orifice.

2. The processing chamber of claim 1, wherein the sidewalls further comprise:
   an annular groove formed therein, the groove and substrate support assembly defining an annular plenum proximate the orifice.

3. The processing chamber of claim 2, wherein the sidewalls further comprise:
   an annular pumping channel formed in the sidewalls, the top portion of the pumping channel open to the annular groove formed in the sidewalls.

4. The processing chamber of claim 3, wherein the sidewalls further comprise:
   an exhaust port formed therein and adapted to couple the pumping channel to a pumping system.

5. The processing chamber of claim 1, wherein the ring further comprises:
   a plurality of holes formed between a first surface and an opposing second surface coupled between the inner edge and the outer edge of the ring.

6. The processing chamber of claim 1, wherein the inner edge of the ring is rounded or chamfered.

7. The processing chamber of claim 1, wherein the ring is coupled to at least one of the lid assembly or sidewalls of the chamber body.

8. The processing chamber of claim 1, wherein the lid assembly further comprises:
   a lid disposed substantially parallel to the bottom of the chamber body; and
   an annular flange extending from a perimeter of the lid to a distal end that seats on the sidewalls of the chamber.

9. The processing chamber of claim 1, wherein the flange further comprises:
   a notch formed in the distal end that receives the outer edge of the ring.

10. A processing chamber comprising:
    a chamber body having sidewalls and a bottom;
    a lid assembly disposed on the sidewalls and enclosing an interior volume of the chamber body, the lid assembly having an annular flange disposed on the sidewalls;
    an exhaust port formed in the sidewalls and adapted for flowing gases from the interior volume;
    a substrate support assembly disposed in the interior volume and having an elevation adjustable relative to the bottom of the chamber;
    an inlet disposed through at least one of the lid assembly or sidewalls, the inlet adapted to flow process gases into the interior volume; and
    an annular ring extending into the interior volume providing a flow restriction between the inlet and exhaust port, the annular ring having an inner end disposed proximate to and radially outward of the substrate support assembly.

11. The processing chamber of claim 10, wherein the substrate support assembly, when in an elevated position, forms an annular orifice of having a distance between the support assembly and the inner end of about 100 to about 300 mils.

12. The processing chamber of claim 10, wherein the ring has an outer end coupled to the lid assembly.

13. The processing chamber of claim 10, wherein the ring further comprises:
    a plurality of holes formed through the ring in a spaced-apart relation outward of the substrate support assembly.

14. The processing chamber of claim 10 further comprising:
    a seal disposed between the ring and substrate support assembly, the seal adapted to substantially prevent gas flow between the ring and substrate support assembly when the support assembly is elevated to an upper position.

15. The processing chamber of claim 14, wherein the ring further comprises:

a plurality of holes formed through the ring in a spaced-apart relation defining a flow control orifice between the inlet and exhaust port.

16. The processing chamber of claim 14, wherein the seal has an annular lip orientated radially outwards from a central section, the lip adapted to sealingly contact the substrate support assembly.

17. The processing chamber of claim 14, wherein the ring includes a groove formed from therein that is adapted to retain the seal to the ring.

18. A processing chamber comprising:

a chamber body having sidewalls and a bottom;

a lid assembly disposed on the sidewalls and enclosing an interior volume of the chamber body;

a substrate support assembly disposed in the interior volume of the chamber body and having an elevation adjustable between the lid assembly and the bottom of the chamber body; and a ring disposed between the lid and sidewalls, the ring having an outer edge disposed proximate the sidewalls and an inner edge disposed proximate the substrate support assembly, the ring having a plurality of holes formed therethrough; and a seal adapted to prevent flow between the substrate support assembly and the ring when the substrate support assembly is disposed in an elevated position.

19. The chamber of claim 18, wherein the seal is coupled to the ring.

\* \* \* \* \*